(12) United States Patent
Papotto et al.

(10) Patent No.: US 11,442,142 B2
(45) Date of Patent: Sep. 13, 2022

(54) INTERFERENCE-CANCELING RF RECEIVER CIRCUIT, CORRESPONDING SYSTEM, RADAR SENSOR SYSTEM, VEHICLE AND METHOD

(71) Applicant: STMicroelectronics S.r.l., Agrate Brianza (IT)

(72) Inventors: Giuseppe Papotto, Biancavilla (IT); Egidio Ragonese, Aci Catena (IT); Claudio Nocera, Misterbianco (IT); Alessandro Finocchiaro, Catania (IT); Giuseppe Palmisano, s. Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 337 days.

(21) Appl. No.: 16/795,977

(22) Filed: Feb. 20, 2020

(65) Prior Publication Data

US 2020/0278420 A1   Sep. 3, 2020

(30) Foreign Application Priority Data

Feb. 28, 2019   (IT) .................. 102019000002907

(51) Int. Cl.
*G01S 7/03* (2006.01)
*H03F 1/56* (2006.01)
(Continued)

(52) U.S. Cl.
CPC ............. *G01S 7/023* (2013.01); *G01S 7/038* (2013.01); *H03D 7/1466* (2013.01); *H03F 1/56* (2013.01); *H03F 3/19* (2013.01); *H03F 2200/451* (2013.01)

(58) Field of Classification Search
CPC ...... G01S 7/023; H03F 1/56; H03F 2200/451; H03F 3/19; H04B 1/0475; H04B 1/525
See application file for complete search history.

(56) References Cited

U.S. PATENT DOCUMENTS 8,897,404 B2 * 11/2014 Weinholt ............. H04L 7/0016
375/347
9,571,205 B1 * 2/2017 Suarez .................. H04B 1/525
(Continued)

FOREIGN PATENT DOCUMENTS

EP            2587679 A1    5/2013

OTHER PUBLICATIONS

IT Search Report and Written Opinion for IT Appl. No. 102019000002907 dated Nov. 12, 2019 (8 pages).
(Continued)

*Primary Examiner* — Thanh C Le
(74) *Attorney, Agent, or Firm* — Crowe & Dunlevy

(57) ABSTRACT

An input receives a radio frequency (RF) signal having an interfering component superimposed thereon. The RF signal is mixed with a local oscillator (LO) signal and down-converted to an intermediate frequency (IF) to generate a mixed signal which includes a frequency down-converted interfering component. The mixed signal is amplified by an amplifier to generate an output signal. A feedback loop processes the output signal to generate a correction signal for cancelling the frequency down-converted interfering component at the input of the amplifier. The feedback loop includes a low-pass filter and a amplification circuit which outputs the correction signal.

13 Claims, 5 Drawing Sheets

(51) Int. Cl.
  *G01S 7/02* (2006.01)
  *H03D 7/14* (2006.01)
  *H03F 3/19* (2006.01)

(56) References Cited

U.S. PATENT DOCUMENTS

| | | | |
|---|---|---|---|
| 9,692,473 B2 | 6/2017 | Gard et al. | |
| 2020/0083936 A1* | 3/2020 | Gupta | H04B 1/1081 |
| 2020/0116817 A1* | 4/2020 | Chuo | H04L 27/2627 |
| 2021/0258037 A1* | 8/2021 | Steigert | H04B 1/0483 |

OTHER PUBLICATIONS

Medra, et al. "An 80 GHz Low-Noise Amplifier Resilient to the TX Spillover in Phase-Modulated Continuous-Wave Radars." IEEE Journal of Solid-State Circuits 51 (2015): 1141-1153.

Lin, et al. "A Ka-Band FMCW Radar Front-End with Adaptive Leakage Cancellation." IEEE Transactions on Microwave Theory and Techniques 54 (2006): 4041-4048.

Guermandi Davide et al: "19.7 A 79GHz binary phase-modulated continuous-wave radar transceiver with TX-to-RX spillover cancellation in 28nm CMOS", 2015 IEEE International Solid-State Circuits Conference—(ISSCC) Digest of Technical Papers, IEEE, Feb. 22, 2015 (Feb. 22, 2015), pp. 1-3, XP032748296, DOI: 10.1109/ISSCC.2015.7063072.

\* cited by examiner

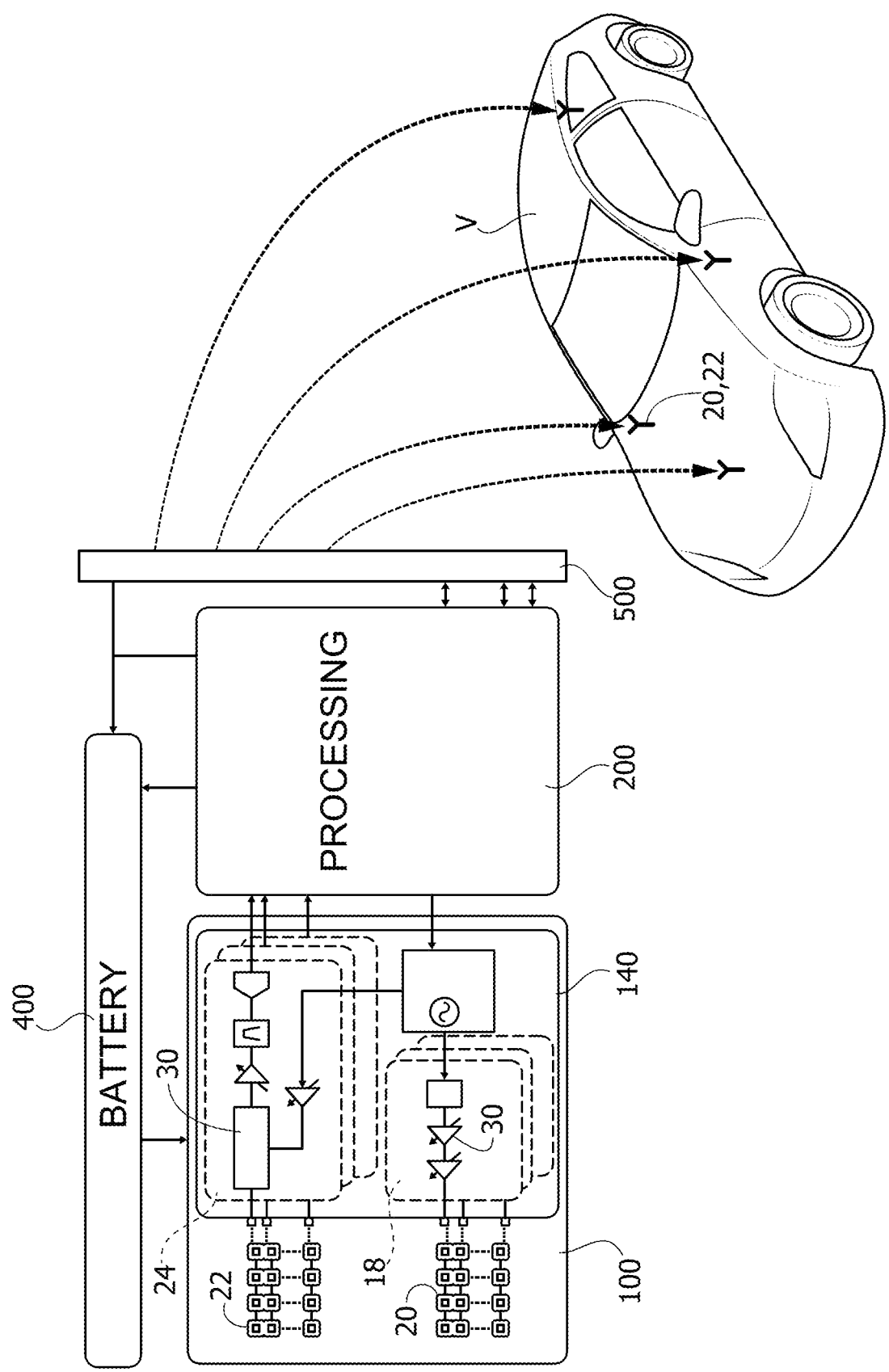

INTERFERENCE-CANCELING RF RECEIVER CIRCUIT, CORRESPONDING SYSTEM, RADAR SENSOR SYSTEM, VEHICLE AND METHOD

PRIORITY CLAIM

This application claims the priority benefit of Italian Application for Patent No. 102019000002907, filed on Feb. 28, 2019, the content of which is hereby incorporated by reference in its entirety to the maximum extent allowable by law.

TECHNICAL FIELD

The present description relates to Radio-Frequency (RF) receivers, particularly of the Continuous-Wave (CW) type.

One or more embodiments may be used, e.g., in automotive radar sensor applications.

BACKGROUND

Increasingly higher demand for driving safety standards has led to a widespread adoption of Advanced Driver Assistance System (ADAS) in the automotive field.

ADAS implement control systems which may exploit several sensors, e.g., radar sensors, to provide functionalities such as adaptive cruise control, collision-avoidance, park assist, etc.

A vehicle may comprise a plurality of radar sensors to facilitate detecting position and speed of objects nearby. For instance, the radar sensors may operate by transmitting a signal, e.g. millimeter-wave signal (24/77 GHz according to ETSI standard, where 1 GHz=1 GigaHertz=$10^9$ Hz), and receiving an echo signal, reflected by the object nearby.

FIG. 1A is exemplary of one or more embodiments of a vehicle V equipped with a radar sensor to detect an object O.

Distance and speed of the object O are detected by measuring a time delay d between a transmitted signal (whose wave-front is shown in solid lines) and the received echo signal (whose wave-front is shown in dashed lines).

The echo signal received by the radar sensor has an echo power $P_R$ which may be expressed as:

$$P_R = P_T \frac{G_T G_R \sigma \lambda^2}{(4\pi)^3 R^4}$$

where:
$P_T$: transmitted power, e.g. $P_T$=10 dBm;
$G_T$, $G_R$: transmitter and receiver antenna gain, respectively, e.g. $G_T$=$G_R$=20 dBi;
$\lambda$: wavelength of the transmitted signal;
$\sigma$: radar cross section of the object;
R: distance between the radar sensor and the object, which in a typical application scenario (e.g. medium and long-range radar) may range from 250 m to 2 m.

The echo power $P_R$ may typically range from −110 dBm to −30 dBm.

Automotive radar sensors usually adopt a Continuous-Wave (CW) direct-conversion architecture, as exemplified in FIG. 1B, to reduce complexity and power consumption.

CW radar is a type of radar system where a known stable frequency continuous wave radio energy is transmitted and then received from any reflecting objects, so a radio-frequency "front-end" of a CW radar sensor transmits and receives at the same time.

FIG. 1B shows an exemplary block diagram of a radar sensor, e.g., comprising a radar sensor Integrated Circuit 10 by referring to the exemplary case of an, e.g., Frequency-Modulated Continuous-Wave (briefly, FMCW) radar sensor 10 capable of detecting an object O at distance (range) R.

Such a sensor may include a Radio-Frequency (RF) synthesizer 12 generating a local oscillator signal LO fed to a (transmitter) amplifier 14, e.g., a Variable-Gain Amplifier (VGA) or a power amplifier. The amplifier 14 may in turn operate/drive a transmission (TX) antenna 20.

A corresponding incoming (echo) signal received at a receiving (RX) antenna 22 may be fed to a RF down-converter or RF receiver stage 24 comprising:
a low noise amplifier (LNA) 26 and a mixer stage 28 fed with the local oscillator signal LO to produce a down-converted intermediate frequency (IF) signal.

Automotive radar sensors may suffer from so-called "TX-to-RX spillover", meaning a cross-talk between transmitted (TX) and received (RX, echo) signals within the sensor. Such an issue may pose severe limitations to radar sensor receiver linearity and performance.

As exemplified in FIG. 2A, a parasitic leakage component $P_L$ may be present, for instance due to a portion $P_L$ of the transmitted power $P_T$ output leaking to the input of the receiver antenna 22, e.g., due to the crosstalk between TX 20 and RX antennas 22 or finite attenuation on the circulator.

As a result, as exemplified in the power-frequency diagram of FIG. 2B, the receiver 22 may sense a blocking signal $P_L$ at the same frequency f of the transmitted signal power $P_T$ and whose power level $P_L$ may be much higher than the echo signal, e.g. $P_T$=10 dBm, $P_L$=−10 dBm, $P_R$=−110 dBm<<$P_L$.

Such a high-level blocking signal $P_L$ may translate into a direct-current (DC) offset component at receiver down-converter level, which may potentially lead to receiver saturation. As a result, receiver linearity becomes stringently constrained and is of utmost importance, especially for low-supply-voltage implementations.

Known approaches to solve the problem of the TX-to-RX spillover may employ a dedicated spillover cancellation circuit block, coupled at the LNA input, wherein a replica of the TX signal is fed to the LNA input to suppress TX-to-RX spillover and wherein phase and amplitude of the TX replica signal are digitally controlled.

For instance, a solution as discussed in document Lin, et al. "A Ka-Band FMCW Radar Front-End with Adaptive Leakage Cancellation." IEEE Transactions on Microwave Theory and Techniques 54 (2006): 4041-4048 (incorporated by reference) discusses monostatic frequency modulation continuous wave radars that use one antenna to simultaneously transmit and receive signals; a real-time digital signal processing scheme is proposed to cancel the transmitter leakage at the receiver front-end and to achieve high isolation, with a digital implementation showing precise control of the leakage cancellation.

Such precise control of the leakage cancellation, on the other hand, may be costly in terms of high complexity and power consumption, due to the digital nature of the implementation. In fact, it may be costly to obtain high sensitivity to phase and amplitude of the TX replica signal: a 30-dB suppression may call for an amplitude and phase accuracy as low as 0.25 dB and 1°, respectively.

Other known approaches may employ a dedicated spillover cancellation circuit block coupled at the LNA output, wherein again a TX replica signal with same amplitude and opposite phase with respect to the TX leakage may be generated from the TX signal and injected at the LNA output and wherein the phase may be adjusted by a digitally controlled phase shifter while the TX replica signal amplitude is controlled by an analog control loop.

For instance, such a solution is discussed in document Medra, et al. "An 80 GHz Low-Noise Amplifier Resilient to the TX Spillover in Phase-Modulated Continuous-Wave Radars." IEEE Journal of Solid-State Circuits 51 (2015): 1141-1153 (incorporated by reference) which discusses an 80 GHz transmitter leakage cancellation circuit integrated together with a low-noise amplifier (LNA) as part of a receiver front-end for a phase-modulated continuous-wave radar, wherein the cancellation may be achieved by subtracting a copy of the leakage signal from the received one at the output of the LNA; the system incorporates an analog feedback loop to adjust the amplitude of the leakage copy, as well as a vector modulator to adjust its phase.

Such a solution may present the following drawbacks:
use of a digital control loop;
stringent LNA linearity constraints;
high complexity and power consumption;
low TX spillover immunity (e.g., −20 dBm).

Despite the extensive activity in that area, as witnessed e.g. by various documents discussed in the foregoing, further improved solutions are desirable.

SUMMARY

In an embodiment, a low-noise high-linearity RF receiver down-converter circuit comprises a mixer-first topology exploiting a current-driven quad with active load.

One or more embodiments may relate to a system (e.g. in a radar) that includes the circuit.

A system employing the high-linearity down-converter with self-cancellation of the TX-to-RX spillover may be used for automotive radar applications.

One or more embodiments may comprise a vehicular radar sensor system utilizing the circuit.

One or more embodiments may relate to a corresponding vehicle (e.g., a car vehicle equipped with the circuit or system).

One or more embodiments may relate to a corresponding method.

One or more embodiments may facilitate reducing the cross-talk between transmitted and received signals in a CW radar sensor.

One or more embodiments may include an unconventional receiver circuit architecture, without the employ of a low-noise amplifier (LNA) and without voltage gain stages at the RF level.

In one or more embodiments, a down-converter conversion gain may be provided mainly at intermediate frequency (IF) level, resulting in reduced complexity.

One or more embodiments may facilitate low-voltage supply by avoiding voltage amplification at the RF level, hence improving the linearity of the down-converter.

One or more embodiments may include a spillover cancellation circuit coupled at mixer output.

In one or more embodiments, a TX-to-RX spillover cancellation circuit may be embedded in an active load, facilitating to sink the TX-leakage current, e.g. facilitating preventing the saturation of the down-converter output due to the parasitic leakage current.

One or more embodiments may facilitate improving immunity of radar sensors to TX-to-RX spillover, thus relaxing the linearity requirements of the radar sensor receiver with a low-power, low-complexity and fully analog solution.

In one or more embodiments, a solution as disclosed herein may present the following advantages:
high linearity with good noise performance thanks to a mixer-first topology, for instance employing a current-driven quad;
low complexity and low power consumption thanks to the cancellation circuit performed at lower frequency at the mixer output (i.e., at IF frequency);
high immunity to TX spillover;
fully analog solution, without additional digital control loop for the TX spillover cancellation;
very suitable for low-voltage CMOS implementation.

In one or more embodiments, solving the TX-to-RX spillover problem may advantageously use a relatively simplified fully analog, low power solution (without any replica high frequency signal generating circuit), hence suitable for low supply level devices and systems.

One or more embodiments of a RF receiver circuit may comprise: an RF input port (; an input network, configured to receive a RF signal, e.g. a voltage signal, at said RF input port and to provide a RF current signal, said RF signal having a interfering component superimposed thereon, for instance caused by TX-RX cross-talk.

The RF receiver circuit may further comprise: a mixer circuit, comprising a RF input, a LO input and an IF output and configured to: a) receive said RF current signal at said RF input; b) receive a LO signal at said LO input; c) provide a mixed signal at said IF output, wherein the mixed signal comprises a frequency down-converted interfering component.

The RF receiver circuit may further comprise an interference-canceling loop configured for providing as an output a corrected IF signal and comprising:
an amplifier circuit having an input and an output, wherein said input of the amplifier circuit is coupled to said IF output of the mixer circuit, and
a feedback network configured to generate a compensation current at said input of said amplifier circuit as a function of the signal at the output of said amplifier circuit, thereby removing said frequency down-converted interfering component in said mixed signal.

In one or more embodiments, the feedback network may comprise a trans-conductance amplifier circuit and a low-pass filter stage, the trans-conductance amplifier having input nodes coupled to said output via said low-pass filter stage.

In one or more embodiments, the amplifier circuit may comprise a trans-impedance amplifier having input nodes coupled to the mixer IF output, and output nodes coupled to said input nodes of the feedback network.

In one or more embodiments, the input network may comprise an impedance matched voltage-to-current converter network, and the mixer circuit may comprise a passive mixer, for instance a switch quad, preferably comprising a passive Gilbert-cell.

One or more embodiments of a system may comprise at least one antenna, a local oscillator, and one or more embodiments of a RF receiver circuit.

The at least one antenna may be coupled to the RF input port of said RF receiver circuit and the local oscillator may be coupled to the LO input of the mixer circuit.

One or more embodiments may comprise a vehicular radar sensor system comprising one or more embodiments of the system or of the RF receiver circuit.

One or more embodiments may comprise a vehicle equipped with one or more embodiments of a vehicular radar sensor system.

One or more embodiments may comprise a corresponding method, which may comprise:

receiving a RF signal having a interfering component superimposed thereon, wherein receiving the RF signal may comprise receiving the RF signal as a voltage signal and converting it to a current signal;

receiving a LO signal generated in an oscillator, and applying signal mixing to said RF signal and said LO signal and providing a mixed signal comprising a frequency down-converted interfering component, amplifying said mixed signal in a feedback loop, and applying interference-canceling feedback in said feedback loop, thereby removing said IF interferer component in said mixed signal, and providing a corrected IF signal to user stages.

In one or more embodiments, receiving the RF signal may comprise applying impedance matching.

BRIEF DESCRIPTION OF THE DRAWINGS

One or more embodiments will now be described, by way of non-limiting example only, with reference to the annexed Figures, wherein:

FIG. 6 is an exemplary diagram of a radar system and a vehicle.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The references used herein are provided merely for convenience and hence do not define the extent of protection or the scope of the embodiments.

Figure 1B:
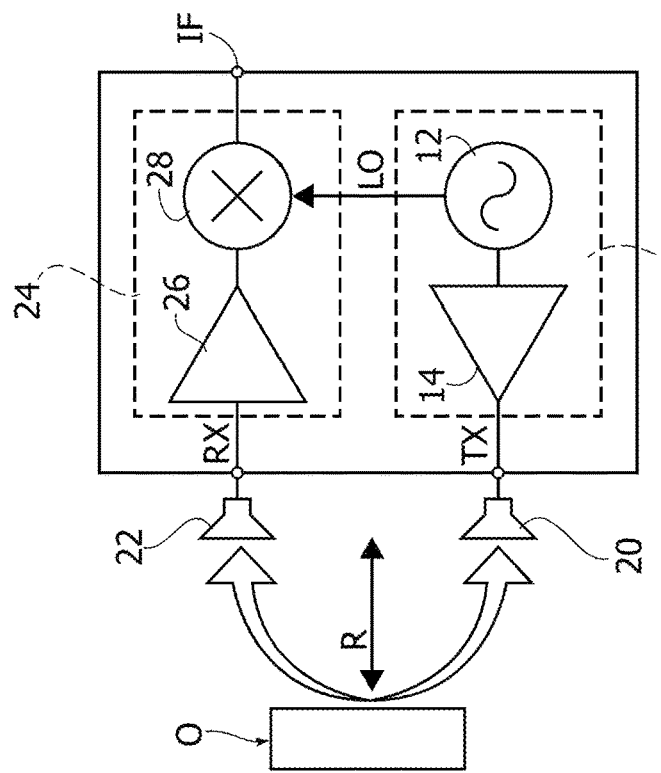
FIG. 1B is an exemplary block diagram of a radar sensor.
Figure 1A:
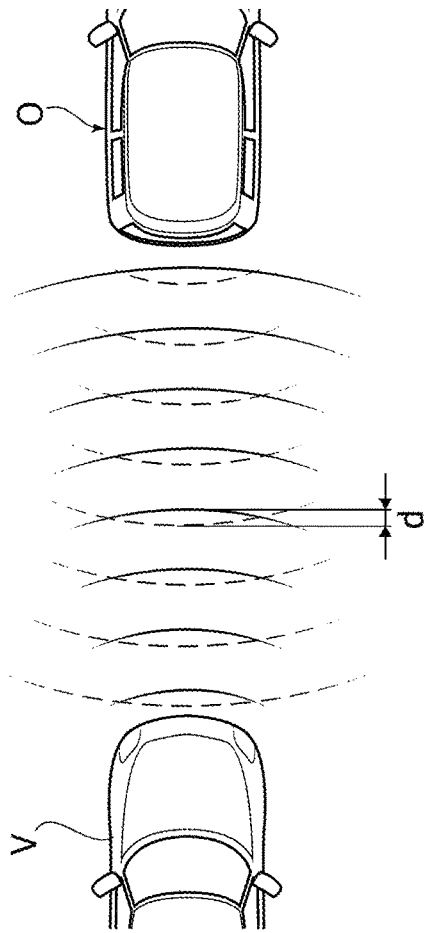
FIG. 1A shows a vehicle equipped with a radar sensor to detect an object.
Figure 2A:
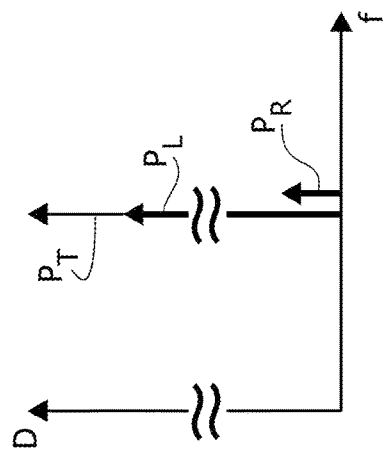
FIG. 2A illustrates a parasitic leakage concern with the sensor of FIG. 1A.
Figure 2B:
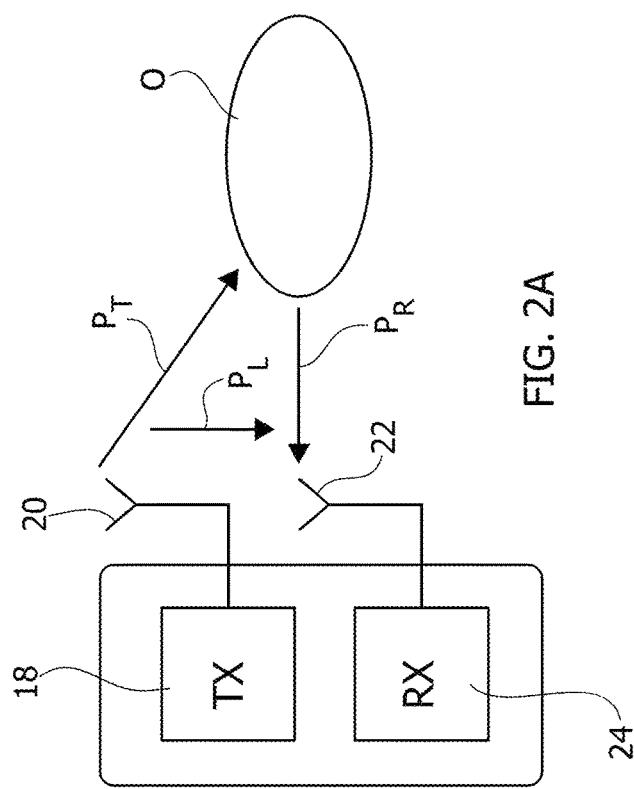
FIG. 2B is a frequency diagram.
Figure 3:
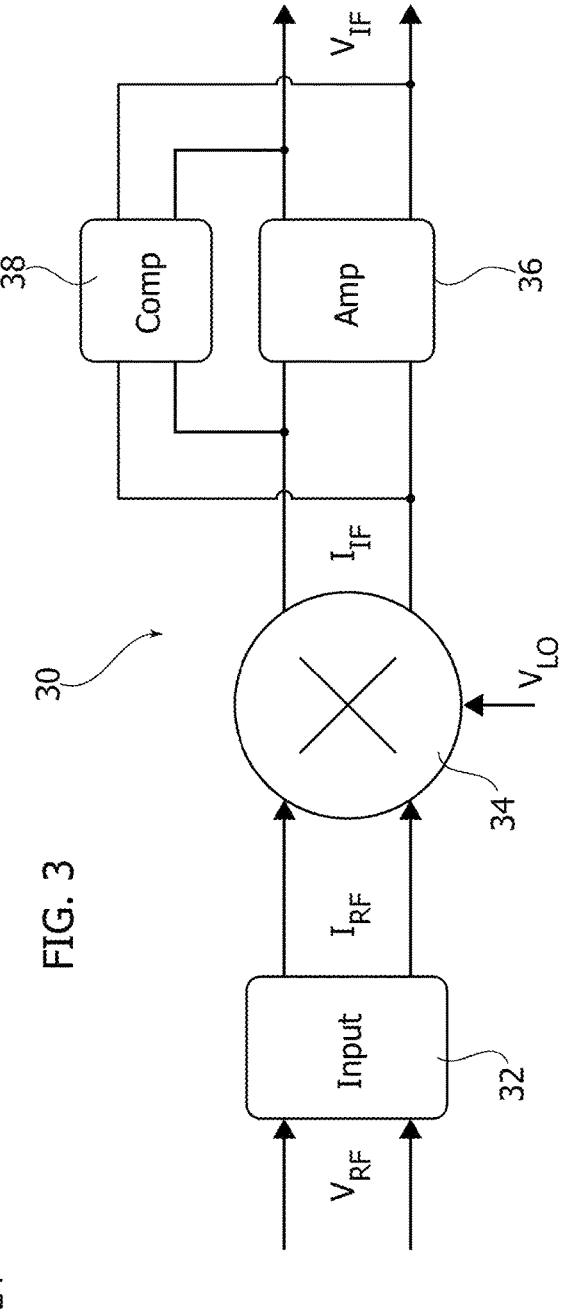
FIG. 3 is an exemplary diagram of one or more embodiments of a RF receiver circuit.

FIG. 3 is exemplary of a radio frequency to intermediate frequency (RF-to-IF) converter circuit 30 architecture according to one or more embodiments.

In one or more embodiments, the down-converter circuit 30 may comprise:

an input network 32, configured to receive an RF signal $V_{RF}$ at an RF input port and to provide an RF current signal $I_{RF}$, e.g., a voltage-to-current (V2I) converter circuit, configured to receive and propagate an RF signal, e.g., a voltage signal $V_{RF}$; the RF signal $V_{RF}$ may have an interfering component $V_L$, e.g., generated by leakage in an antenna 20, 22 or by spurious signals in the environment surrounding the component, superimposed to an echo signal component $V_R$, e.g., $V_{RF}=V_R+V_L$ where $V_L$ is a voltage associated to leakage, as discussed in the foregoing;

a mixer stage 34, e.g., a three-port network circuit block configured to receive the RF signal $I_{RF}$ and a local oscillator signal, e.g., a voltage signal $V_{LO}$, at respective input ports, and provide at an output port a mixed signal $I_{IF}$, wherein the mixed signal $I_{IF}$ is a frequency down-converted version of the RF signal $I_{RF}$, e.g., resulting from signal multiplication $I_{IF}=I_{RF}*f(V_{LO})$;

an interference-canceling feedback loop 36, 38 comprising an active load such as an amplifier circuit (Amp) 36 and a, e.g., retroactive, compensation (Comp) stage 38, coupled at the mixer output port, comprising circuitry configured to receive and amplify the mixed signal $I_{IF}$ and to remove therefrom, e.g. by negative feedback loop compensation, a leaked interfering component of the signal.

In one or more embodiments, the compensation stage is coupled across the active load 36, so as to provide as an output of the active load a compensated IF signal, the compensated IF signal having compensated said IF interfering component in said mixed signal.

In one or more embodiments, inventors have observed that working with a RF current signal in place of a RF voltage signal may improve linearity performance of the down-converter 30.

In one or more embodiments, the absence of a low-noise amplifier circuit block may improve linearity performance of the down-converter 30.

Figure 4:
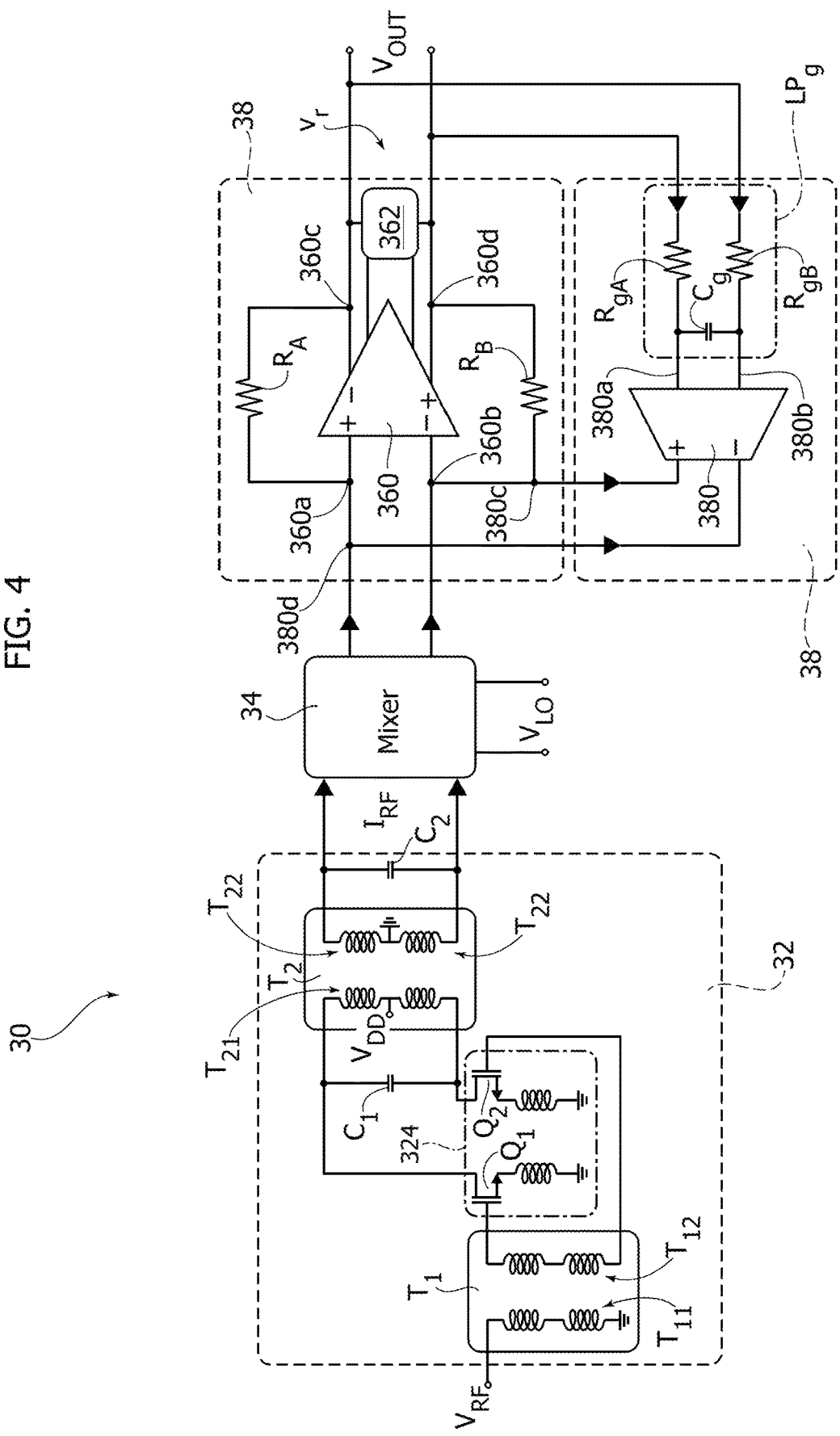
FIG. 4 is an exemplary diagram of details of the RF receiver circuit of FIG. 3.

FIG. 4 is exemplary of one or more embodiments of the down-converter circuit arrangement 30.

In one or more embodiments, the input network 32 may comprise, as exemplified in FIG. 4:

a first transformer $T_1$, comprising a first primary winding branch $T_{11}$ and a first secondary winding branch $T_{12}$, a differential stage 324, comprising a first and a second transistor $Q_1$, $Q_2$, for instance a pair of MOSFET transistors in a common-source configuration having first control terminal coupled to a node of first secondary winding $T_{12}$ in the first transformer $T_1$ and a second control terminal coupled to a second node of the first secondary winding $T_{12}$ in the first transformer $T_1$, for instance first $Q_1$ and second $Q_2$ transistor control terminals coupled across the first secondary winding $T_{12}$ in the first transformer $T_1$, and a second transformer stage $T_2$, comprising a second primary winding branch $T_{21}$ and a second secondary winding branch $T_{22}$.

In one or more embodiments, a first capacitor may be coupled between output terminals of the first and second transistors $Q_1$, $Q_2$ while a second capacitor $C_2$ may be coupled across the second secondary winding $T_{22}$ in the second transformer $T_2$.

The input network 32, as mentioned, operates substantially as a voltage-to-current converter, from a voltage RF signal output by the receiver antenna to a current RF signal.

Such a voltage-to-current converter may be obtained employing the differential stage 324, e.g., with the differential pair of transistors Q1, Q2 in a common gate configuration, designed to facilitate obtaining an impedance matching, e.g., a 50 Ohm matching, and a low noise figure.

In one or more embodiments, the first secondary winding $T_{12}$ is coupled to control terminals of the first and second transistor Q1, Q2 in the differential stage 324. The differential stage 324 provides a 50 Ohm input thus showing a low impedance to the input node.

Such an input network arrangement 32 may facilitate avoiding saturation in the down-converter circuit 30: in fact, since the interfering component $I_L$ has a high value with respect to the RF signal value, closing the converter 32 on a high load may saturate the down-converter. Such a problem is hardly avoidable with the customary employ of a Low Noise Amplifier stage to receive the RF signal $V_{RF}$, since LNA has a high load in order to provide a high gain.

Conversely, such a linearity constraint problem may be solved employing a low impedance provided by virtual ground of the trans-impedance amplifier, as discussed herein.

In one or more embodiments, the mixer stage 34 may comprise a passive mixer circuit block, wherein the output mixed signal $I_F$ has a lower power than the input signals $V_{LO}$, $I_{RF}$. Specifically, the mixer stage 34 may comprise a switch quad, e.g., a passive mixer based on a Gilbert-cell known per se. For instance, the passive mixer 34 may advantageously achieve a low noise figure (NF), specifically reduced IF flicker noise.

In one or more embodiments, the amplifier circuit 36 may comprise a Trans-Impedance Amplifier (TIA) comprising:
a differential stage 360, for instance an operational amplifier having a non-inverting input node 360a, an inverting input node 360b, an inverting output node 360c and a non-inverting output node 360d, wherein the input nodes 360a, 360b are at virtual ground,
a first resistive branch $R_A$ coupled to the non-inverting input 360a and to the inverting output 360c,
a second resistive branch $R_B$ coupled to the inverting input 360b and to the non-inverting output 360d.

In an exemplary embodiment according to FIG. 4, the resistive branches $R_A$ and $R_B$ may have the same value of resistance, e.g., $R_A=R_B=R$.

In one or more embodiments, the differential stage may be coupled to a Common Mode Feedback Circuit (CMFC) stage 362, known per se.

In one or more embodiments, an output voltage $V_{OUT}$ is sensed across the output nodes 360c, 360d of the trans-impedance amplifier differential stage 360.

In one or more embodiments, the feedback network 38 may comprise a trans-conductance amplifier 380 and a low-pass filter LPg, for instance a low-pass filter configured to preserve the IF signal component related to the echo signal to be detected.

For instance, the low-pass filter LPg may be coupled between the output of the amplifier 36 and the input 380a, 380b of the transconductance amplifier 380 and may comprise a first resistance $R_{gA}$, a second resistance $R_{gB}$ and a capacitor $C_g$ coupled between input nodes 380a, 380b of the transconductance amplifier 380.

In one or more embodiments, the trans-conductance amplifier 380 may comprise:
a non-inverting input node 380a, coupled via a first resistance $R_{gA}$ to the non-inverting output node 360d in the trans-impedance amplifier 360,
an inverting input node 380b, coupled via a second resistance $R_{gB}$ to the inverting output node 360c in the trans-impedance amplifier 360,
a first output node 380c, coupled to the inverting input 360b in the trans-conductance amplifier 360, and
a second output node 380d, coupled to the non-inverting input node 360a in the trans-impedance amplifier 360.

Figure 5:
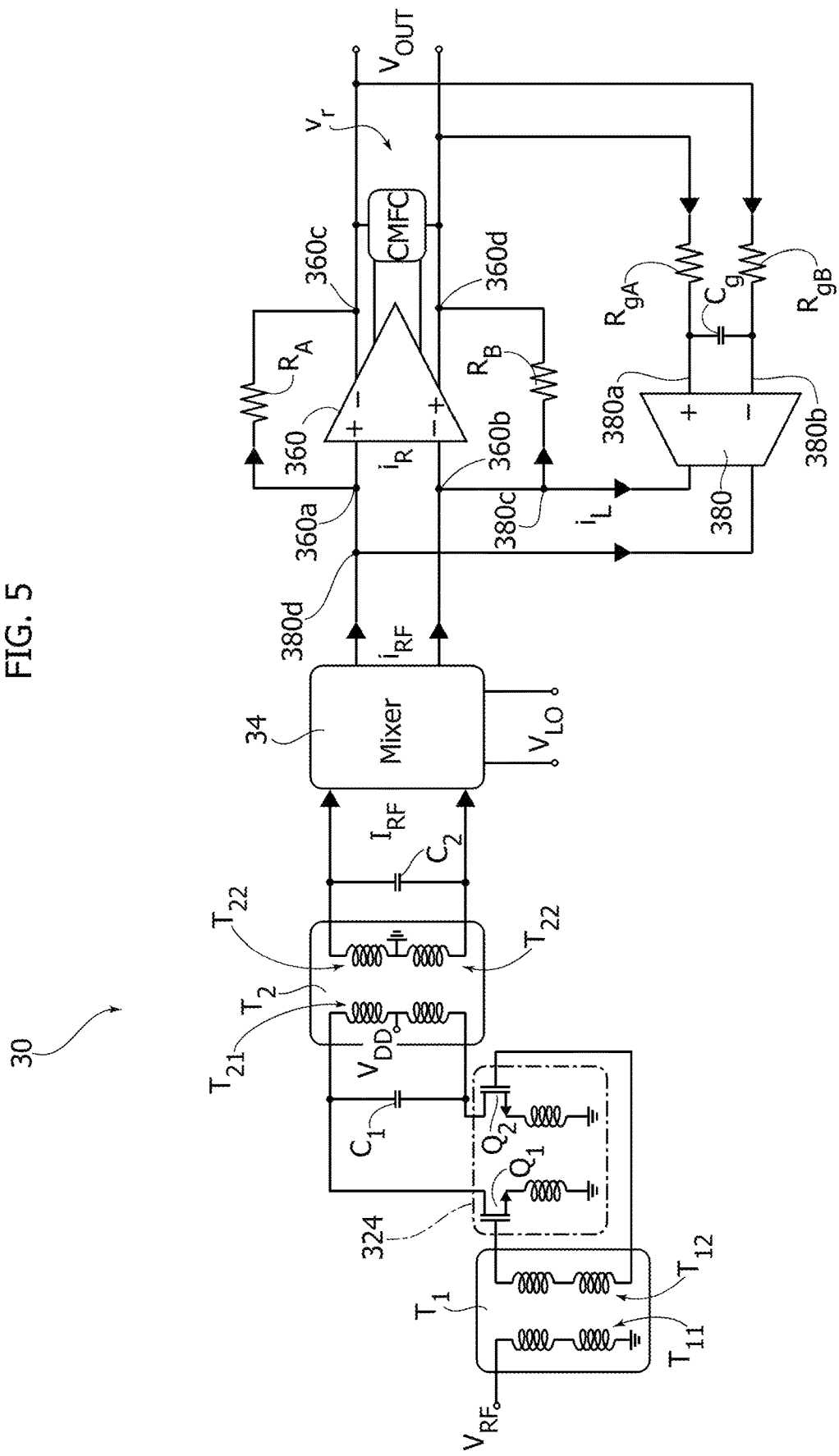
FIG. 5 is an exemplary diagram of principles underlying embodiments of FIG. 4.

FIG. 5 is exemplary of operating principle underlying one or more embodiments of the down-converted circuit 30 as exemplified in FIG. 4.

Unless otherwise discussed in the following, in FIG. 5 parts or elements like parts or elements already discussed in the foregoing are indicated with like reference/numerals, so that a corresponding detailed description will not be repeated here for brevity.

As mentioned, the first primary winding branch $T_{11}$ in the first transformer $T_1$ the input network 32, receives an RF voltage signal $V_{RF}$ comprising a leaked interfering component $V_L$ superimposed to a signal $V_R$, e.g., an echo signal received in a radar sensor, which may be expressed as $V_{RF}=V_R+V_L$.

As a result of the voltage-to-current conversion in the input network 32, the second transformer $T_2$ may provide across its second secondary winding $T_{22}$ a current $I_{RF}$ which may also comprise an equivalent leaked interfering component $I_L$ superimposed to a signal $I_R$, which may be expressed as $I_{RF}=I_R+I_L$.

Such a current signal $I_{RF}$, e.g., converted from the voltage RF signal $V_{RF}$, may be multiplied in the mixer stage 34 with the signal $V_{LO}$ from the local oscillator (LO), hence providing a down-converted IF current signal $i_{IF}$ which comprises a down-converted leaked interfering component $i_L$ superimposed to a down-converted signal component $i_R$, which may be expressed as $i_{IF}=i_R+i_L$. At this point, the active load 36 and the compensation circuit 38, as a result of their feedback arrangement, may operate in an equivalent way to each receiving a component in the IF signal: specifically, the trans-impedance amplifier 360 in the active-load stage 36 may receive the signal component $i_R$ while the trans-conductance amplifier 380 may receive the down-converted leakage interfering component $i_L$.

In one or more embodiments, the transconductance amplifier 380 and the low-pass filter LPg may be configured to self-cancel the interfering component $i_L$, e.g. by filtering and compensating.

At the same time, the trans-impedance amplifier 360 may convert the current signal $i_R$ to a voltage signal hence providing a voltage output signal $V_{OUT}$ in the IF frequency range, hence frequency down-converted from RF, without any interfering component due to leakage/cross-talk in the antenna.

FIG. 6 is exemplary of a vehicle V which may be equipped with at least one radar sensor system 100 comprising:
a TX/RX antenna 20, 22 such as, for instance, a set of patch-array antennas, and
at least one RF receiver circuit 30, providing a robust and accurate object-detection system and method, increasing road safety.

In one or more embodiments the system 100 may further comprise further processing stages 200 and communication interfaces 500 and a battery 400 to provide power supply circuits in the system 100.

For instance, the radar sensor system 100 in the vehicle V may provide support to a vehicle driver, e.g., via an Automated Driving Assistance System ADAS capable to take control over the vehicle, in detecting people passing on zebra-crossings during the night or in adverse eye visibility conditions, hence facilitating to reduce road accidents.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection. The extent of protection is defined by the annexed claims.

The claims are an integral part of the technical teaching provided herein with reference to the embodiments.

The invention claimed is:

1. A radio frequency (RF) receiver circuit, comprising:
   an RF input port;
   an input network configured to receive an RF signal from said RF input port and to provide an RF current signal, said RF signal having an interfering component superimposed thereon;
   a mixer circuit, comprising a signal input, a local oscillator (LO) input and an intermediate frequency (IF) output and configured to:
      a) receive said RF current signal at said signal input;
      b) receive a LO signal at said LO input; and
      c) provide a mixed signal at said IF output;
   wherein the mixed signal comprises a frequency down-converted interfering component;
   an interference-canceling loop configured to provide at an output a corrected IF signal, wherein the interference-canceling loop comprises:
      an amplifier circuit having an input coupled to said IF output of the mixer circuit and an output; and
      a feedback network configured to generate a compensation current for application to the mixed signal at the input of said amplifier circuit as a function of the signal at the output of said amplifier circuit, thereby removing said frequency down-converted interfering component in said mixed signal.

2. The RF receiver circuit of claim 1, wherein the feedback network comprises a trans-conductance amplifier circuit and a low-pass filter stage, the trans-conductance amplifier having input nodes coupled to said output through said low-pass filter stage.

3. The RF receiver circuit of claim 2, wherein the amplifier circuit comprises a trans-impedance amplifier having:
   input nodes coupled to the mixer IF output; and
   output nodes coupled to said input nodes of the feedback network.

4. The RF receiver circuit of claim 1, wherein:
   the input network comprises an impedance matched voltage-to-current converter network; and
   the mixer circuit comprises a passive mixer.

5. The RF receiver circuit of claim 4, wherein the passive mixer comprises a switch quad type mixer of a passive Gilbert-cell type.

6. The RF receiver circuit of claim 1, further comprising:
   at least one antenna coupled to the RF input port; and
   a local oscillator configured to generate the LO signal.

7. The RF receiver circuit of claim 1, wherein the RF receiver circuit is a component of a vehicular radar sensor system.

8. The RF receiver circuit of claim 7, wherein vehicular radar sensor system is a component of a vehicle.

9. A method, comprising:
   receiving a radio frequency (RF) signal having an interfering component superimposed thereon, wherein receiving the RF signal comprises receiving the RF signal as a voltage signal and converting said voltage signal to a current signal;
   receiving a local oscillator (LO) signal generated by an oscillator;
   signal mixing said RF signal and said LO signal to generate a mixed signal comprising a frequency down-converted intermediate frequency (IF) interfering component;
   amplifying said mixed signal in a feedback loop;
   applying an interference-canceling feedback signal generated by said feedback loop to the mixed signal before amplifying, thereby removing said IF interfering component in said mixed signal; and
   outputting a corrected IF signal to user stages.

10. The method of claim 9, wherein receiving the RF signal comprises applying impedance matching.

11. A circuit, comprising:
   a mixing circuit having a signal input configured to receive a radio frequency (RF) signal which includes a superimposed interfering component, a local oscillator (LO) input configured to receive a LO signal and a signal output generating a downconverted signal at an intermediate frequency (IF) which includes an IF interfering component;
   a trans-impedance amplifier having an input configured to receive the downconverted signal with the IF interfering component and an output configured to generate an amplified IF output signal;
   a filter circuit having an input configured to receive the amplified IF output signal; and
   a trans-conductance amplifier circuit having an input configured to receive a filtered signal output from the filter circuit and an output configured to apply a cancellation signal to the downconverted signal at the input of the trans-impedance amplifier which cancels the IF interfering component present within the downconverted signal.

12. The circuit of claim 11, wherein the low-pass filter is configured to pass frequencies which include a frequency of the IF interfering component.

13. The circuit of claim 11, wherein the mixing circuit comprises a switch quad type mixer of a passive Gilbert-cell type.

* * * * *